United States Patent [19]

Nielsen

[11] Patent Number: 4,773,071
[45] Date of Patent: Sep. 20, 1988

[54] MEMORY FOR STORING RESPONSE PATTERNS IN AN AUTOMATIC TESTING INSTRUMENT

[75] Inventor: Robert E. Nielsen, Farmingville, N.Y.

[73] Assignee: Grumman Aerospace Corporation, Bethpage, N.Y.

[21] Appl. No.: 914,440

[22] Filed: Oct. 2, 1986

[51] Int. Cl.⁴ .............................................. G01R 31/28
[52] U.S. Cl. ...................................................... 371/25
[58] Field of Search ............................ 371/20, 25, 27; 364/200, 900; 365/220, 221, 189

[56] References Cited

U.S. PATENT DOCUMENTS

| | | | |
|---|---|---|---|
| 3,339,181 | 8/1967 | Singleton et al. | 364/900 |
| 3,516,074 | 6/1970 | Enomoto et al. | 364/900 |
| 3,694,757 | 9/1972 | Hanna, Jr. | 455/38 |
| 4,052,702 | 10/1977 | Smith et al. | 364/200 |
| 4,106,109 | 8/1978 | Fassbender | 365/238 |
| 4,139,787 | 2/1979 | Amelio | 307/264 |
| 4,150,364 | 4/1979 | Baltzer | 340/703 |
| 4,159,541 | 6/1979 | Ward et al. | 365/233 |
| 4,330,852 | 5/1982 | Redwine et al. | 365/221 |
| 4,347,587 | 8/1982 | Rao | 365/189 |
| 4,395,764 | 7/1983 | Matsue | 365/78 |
| 4,410,964 | 10/1983 | Nordling et al. | 365/189 |
| 4,412,313 | 10/1983 | Ackland et al. | 365/221 |
| 4,441,182 | 4/1984 | Best et al. | 371/25 |
| 4,491,915 | 1/1985 | Forquer et al. | 364/200 |
| 4,493,055 | 1/1985 | Osman | 365/78 |
| 4,498,155 | 2/1985 | Mohan Rao | 365/189 |
| 4,507,760 | 3/1985 | Fraser | 365/221 |

FOREIGN PATENT DOCUMENTS 54-8429  1/1979  Japan .

OTHER PUBLICATIONS

J. Atlas, R. Nielsen, "High-Speed Test Capability for Emerging Technology," IEEE, 1983, CH1968-7/83/0-00-0463, pp. 463-465.

Primary Examiner—Charles E. Atkinson
Attorney, Agent, or Firm—Pollock, VandeSande & Priddy

[57] ABSTRACT

In an automatic testing instrument, to store responses educed from an equipment (4) under test in response to stimuli sent thereto, a response memory (16) is used. This response memory includes two serial/parallel shift registers (Z5, Z4), a buffer (Z2), a static RAM (Z3) and an input/output buffer (Z1). The response memory is capable of accepting the data bits being transmitted by the equipment under test at different data rates, corresponding to either serial or parallel inputted data bits.

17 Claims, 3 Drawing Sheets

MEMORY FOR STORING RESPONSE PATTERNS IN AN AUTOMATIC TESTING INSTRUMENT

FIELD OF THE INVENTION

The present invention relates to an automatic testing instrument and more particularly to a response memory used in the instrument for storing patterns sent by an equipment under test in response to prior stimulus patterns transmitted thereto.

BACKGROUND OF THE INVENTION

As was disclosed in co-pending application Ser. No. 906,057, by the same inventor and assigned to the same assignee of the instant application, attempts have been made to transmit to an equipment under test stimuli for eliciting therefrom responses which would indicate the operational status of the equipment, after the responses are compared with expected results. Since the number of equipment which may be tested is dependent upon the rate at which the patterns are generated from the automatic testing instrument, it was clear that the faster an automatic testing instrument can send out the stimuli, a greater number of equipment may be tested within a certain given time. In the above-noted co-pending application, a stimulator which can generate stimuli at both high and low data rates is disclosed. To round out the automatic testing instrument, a corresponding response memory, or as discussed in the co-pending application—a responder, is needed.

BRIEF DESCRIPTION OF THE PRESENT INVENTION

The present invention relates to a response memory, in an automatic testing instrument, which is capable of accepting at different data rates data bits of patterns generated by an equipment under test in response to stimuli transmitted thereto. The response memory specifically includes a RAM, an input and output buffer, an octal tri-state buffer and two serial/parallel shift registers. The first shift register is used for loading in the data bits of the response patterns, fed either serially or in parallel from the equipment. If the data bits are fed serially, the shift register would shift these incoming data bits until the register is completely loaded, before unloading these bits in parallel to the second shift register. Upon the next clock pulse, the second shift register would transmit in parallel the data bits to the RAM. If the data bits of the response patterns are fed in parallel to the first shift register, then whatever pattern bits inputted in are transmitted in parallel to the second shift register, which again would feed these pattern bits in parallel to the RAM for storage. After the response patterns have been stored, the processor controlling the automatic testing instrument can withdraw from the memory any of the stored response patterns for determining the operational status of the equipment, in response to a certain stimulus pattern.

It is, therefore, an object of the present invention to provide a response memory capable of storing response patterns at both fast and slow data rates.

It is a second object of the present invention to provide a response memory capable of loading data bits either serially or in parallel.

It is a third object of the present invention to provide a response memory capable of interacting with a corresponding stimulator in the automatic testing instrument.

The above-mentioned objects and advantages of the present invention will become more apparent and the invention itself will be best understood by reference to the following description of an embodiment of the invention taken in conjunction with the accompanying drawings, wherein:

DETAILED DESCRIPTION OF THE PRESENT INVENTION

Figure 1:
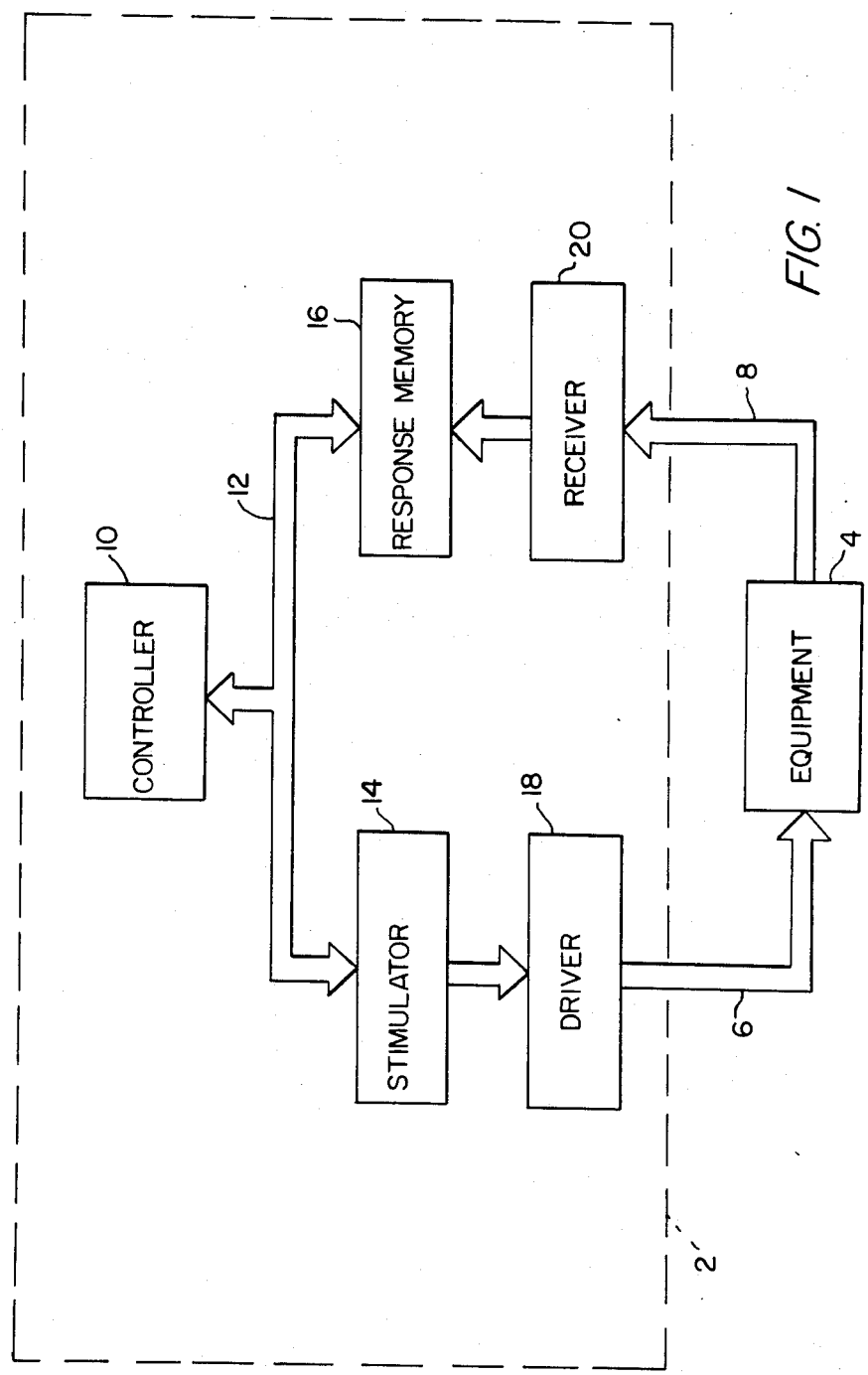
FIG. 1 is a simplified block diagram of an automatic testing instrument.

To put the present invention in proper perspective, an overall view of an automatic testing instrument is given in FIG. 1. It should be kept in mind that FIG. 1 is a simplified block diagram of the automatic testing instrument which does not include the other components, for example the comparator, as disclosed in co-pending application Ser. Nos. 016,685 and 906,057 by the same inventor and assigned to the same assignee of the instant application.

As shown, an automatic testing instrument 2 is connected to an equipment 4 by means of driver line 6 and receiver line 8. Stimulus patterns are sent from the automatic testing instrument via driver line 6 to equipment 4 for stimulating the same. Patterns in response to the stimulus patterns are generated from equipment 4 and transmitted through receiver line 8 back to the automatic testing instrument.

Within automatic testing instrument 2 is a controller 10, which is connected by bus 12 to stimulator 14 and response memory 16. For this embodiment, a microprocessor such as one from the Intel family may be used. Were it desirable to test an equipment with a particular stimulus pattern, controller 10 would send data representing that pattern, as well as instructions, to stimulator 14, which, upon receiving the data and instructions, generates and transmits the appropriate stimuli to driver 18, described in a co-pending application by John M. Weick and assigned to the same assignee with Ser. No. 059,075. The stimulus pattern is driven by driver 18 to equipment 4. Responses, in the form of response patterns, resulting from these stimulus patterns are transmitted by equipment 4 to receiver 20, which is described in a co-pending application by Joseph Langone and Michael Ugenti, assigned to the same to the same assignee with Ser. No. 024,486, now U.S. Pat. No. 4,743,842 issued May 10, 1988. Signals from receiver 20 are then sent to response memory 16, the outputs of which are withdrawn by controller 10 for determining the operational status of equipment 4, in regard to particular stimulus patterns. It should be noted that a comparator, which is disclosed in the aforesaid co-pending application Ser. No. '685 is not shown in FIG. 1, as it is felt that such a comparator is not necessary for the understanding of the present invention.

Figure 2:
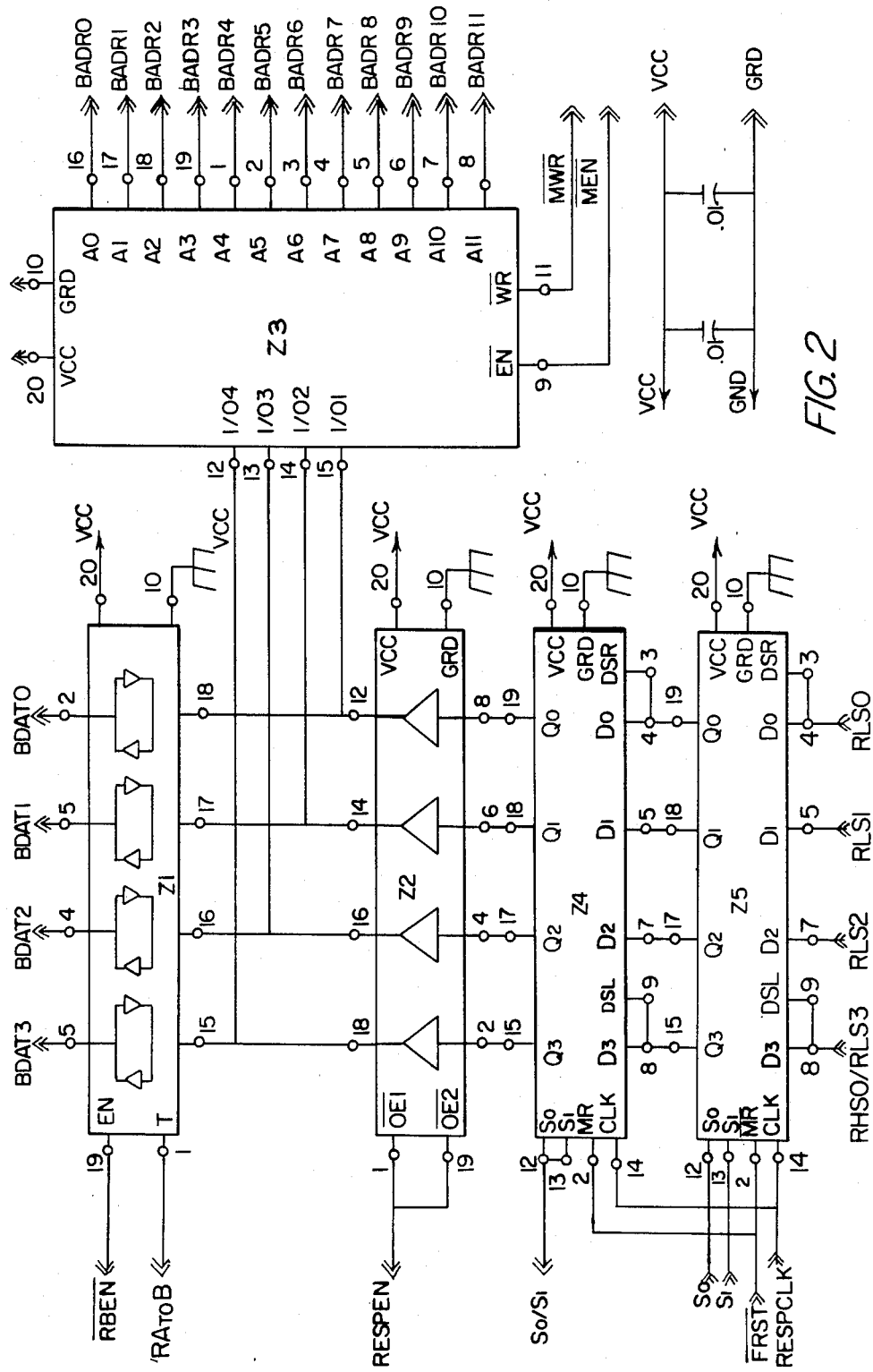
FIG. 2 is a schematic diagram showing one preferred embodiment of the present invention.

Referring now to FIG. 2, there is shown response memory 16 of the present invention. Within response memory 16 are bi-directional bus buffer Z1, tri-state buffer Z2, memory Z3 and serial/parallel shift registers Z4 and Z5.

In relation to the other components of the automatic testing instrument, it should be noted that inputs RHSO/RLS3, RLS2, RLS1 and RLS0 of shift register Z5 are connected to the respective outputs of receiver 20 (See FIG. 1). Shift register Z5 and identical shift register Z4 are conventional serial/parallel 4 bit shift registers made by, for example, Signetics Inc. having a product number 54F194G. As shown, the outputs of Q3, Q2, Q1 and Q0 of shift register Z5 are connected respectively to inputs $d_3$, $d_2$ $d_1$ and $d_0$ of shift register Z4. Of some importance to note is that respective inputs MR and CLK of shift registers Z4 and Z5 are connected to corresponding lines FRST and RESPCLK. The FRST line is a reset line while the RESPCLK line is the timing input for the shift registers. Also of import for shift registers Z4 and Z5 are the respective operational lines $S_0$ and $S_1$, which are used to set the shift registers into the following four possible modes of operation: first, the shift registers can stay in the off state by ignoring clock pulses from line RESPCLK. Second, whatever data is on input pins 4, 5, 7, and 8 of the respective shift registers may be outputted in parallel to output pins 19, 18, 17 and 15, respectively. Third, data may be serially shifted to the left. Fourth, data may be serially shifted to the right.

For the present invention embodiment shown in FIG. 2, it should be noted that shift register Z5 uses the serial shift left mode, were the data being fed serially into shift register Z5. As for shift register Z4, it should be noted that the $S_0$ and $S_1$ lines are joined together to form the $S_0/S_1$ line. Having thus been joined, shift register Z4 is capable of only parallel outputting the data from input pins 4, 5, 7, and 8 directly up to output pins 19, 18, 17 and 15, respectively. Of course, each of the shift registers is powered by the VCC line and is grounded at pin 10 of input GRD.

The output pins 15, 17, 18 and 19 of shift register Z4 are connected to respective input pins 2, 4, 6 and 8 of buffer Z2. Inputs OE1 and OE2 of buffer Z2 are joined and connected to line RESPEN, which is used to activate buffer Z2 for passing therethrough data on input pins 2, 4, 6 and 8 to output pins 18, 16, 14 and 12, respectively. Buffer Z2 is, again, powered by line VCC at pin 20 and grounded at pin 10 of input GRD. Buffer Z2 is a conventional octal tri-state type buffer made by a number of companies including, for example, Fairchild Inc. having product number 54F244.

The outputs of buffer Z2 are connected to both the inputs of bi-directional bus buffer Z1 and the input/output ports of memory Z3. Specifically, output pins 18, 16, 14 and 12 of buffer Z2 are connected respectively to inputs 15, 16, 17, and 18 of bi-directional bus buffer Z1 and respectively to input/output ports I/O4, I/O3, I/O2 and I/O1 of memory Z3. Bi-directional buffer Z1 is controlled by controller 10 (FIG. 1) via lines RBEN and RAtoB. Bi-directional buffer Z1 is a conventional type of buffer made by Signetics Inc. having product number S54LS245G.

Memory Z3, besides having input/output ports I/O4 to I/O1, has 12 address lines BADR0 to BADR11 connected respectively to inputs A0 to A11. Address lines BADR0 to BADR11 are controlled by controller 10 for either placing the data outputted from buffer Z2 into appropriate addresses of the memory or for pulling out specific data in the memory and outputting the same through bi-directional buffer Z1 to controller 10 for checking the operational status of the equipment under test. For controlling memory Z3, lines $\overline{\text{MWR}}$ and $\overline{\text{MEN}}$, which are connected to controller 10, are used. For example, were a 4 bit data pattern on input/output ports I/O1 to I/O4 to be stored into a location (of memory Z3) specified on the address lines, lines $\overline{\text{MWR}}$ and $\overline{\text{MEN}}$ are both enabled. Conversely, if it is desired to withdraw data from memory Z3, then line $\overline{\text{MEN}}$ is enabled while line $\overline{\text{MWR}}$ stays low. In this instance, the data that was stored in the location, corresponding to the binary address configuration appearing on lines BADR0 to BADR11, would be placed at input ports I/O1 to I/O4. Memory Z3 is a 16K RAM made by the Inmos Company having a product number IMS1420-45. It has available approximately 4,000 addresses and it has a data rate of approximately 20 million bits per second.

Assume the operational status of the equipment 4 with respect to a certain stimulus pattern is needed. In operation, controller 10 commands stimulator 14 to feed to driver 18 a particular stimulus pattern for transmission to equipment 4. This stimulus pattern, for the FIG. 2 embodiment, is deemed to have 4 data bits, as the shift registers shown in FIG. 2 are 4 bit serial/parallel shift registers. Upon receipt of the stimulus pattern, equipment 4, in accordance with preprogrammed instructions, performs the task it was programmed for and outputs a pattern, to be referred as the response pattern, in reaction to the stimulus pattern. Like the stimulus pattern, the response pattern also contains 4 data bits. Since the external clock (not shown) for providing clock pulses to the components of automatic testing instrument 2 and equipment 4 has a data rate, for example 50 million bits per second, which is faster than the operational data rate of memory Z3, it is apparent that equipment 4 can transmit the respective data bits of the corresponding response patterns to receiver 20 at a much faster rate than the operational speed of memory Z3. To elaborate, if equipment 4 is to transmit the data bits to receiver 20, which in turn re-transmits the same data at 50 million bits per second to response memory 16, it would be clear that memory Z3 in response memory 16 would not be able to store all of the transmitted data bits.

Suppose the data bits of the response patterns are transmitted from equipment 4 in parallel to response memory 16 and suppose that the respective data bits of a particular response pattern are presented to input pins 8, 7, 5 and 4 of shift register Z5. At the first response clock pulse, which is fed via line RESPCLK to clock input CLK of shift register Z5, the data located on pins 8, 7, 5 and 4 are loaded in parallel into shift register Z5. At the next clock pulse, these same data bits would be transferred to shift register Z4 by means of data lines containing output pins 15, 17, 18, and 19 of shift register Z5. Meanwhile, a new response pattern containing four data bits would be loaded into shift register Z5. This cycle will continue through as many response patterns as are required by controller 10. At the same time, controller 10 activates buffer Z2 by means of line RESPEN, thereby providing for the passage of the data bits appearing at output pins 15, 17, 18 and 19 of shift register Z4 to output pins 18, 16, 14 and 12, respectively, of buffer Z2. Since the outputs of buffer Z2 are connected directly to the inputs of bi-directional buffer Z1 and the input/output ports of memory Z3, these data bits can be both transmitted directly to controller 10 through bi-directional buffer Z1 and stored in a specific location, depending on the setting of address lines BADR0 to BADR11, of memory Z3. In practice, when response patterns are being transmitted to response memory 16 for storage in memory Z3, bi-directional buffer Z1 is deactivated. Consequently, the data bits at the output pins of buffer Z2, instead of being transmitted to both controller 10 and memory Z3, would only be stored in appropriate addresses of memory Z3. As memory Z3 is incremented, sets of response patterns, up to approximately 4,000, are stored therein. The above description pertains to the parallel loading of response memory 16.

When the data bits are being transmitted to response memory 16 serially (at a data rate of approximately 50 million bits per second), each of the data bits is first fed into shift register Z5 at pin 8 thereof. At this time, serial/parallel shift register Z5 is set to a shifting mode—be it left or right. For this example, assume the data is shifted from input $D_3$ to $D_0$. For each clock pulse, a data bit is fed into register Z5 and shifted rightward. For the first clock pulse, the data bit is fed to input $D_3$. At the next clock pulse, the same data bit is shifted to input $D_2$ while a new data bit is fed into input $D_3$. At the next clock pulse, the first data bit is shifted to input $D_1$; and finally, at a fourth clock pulse, it is shifted to input $D_0$. After buffer Z5 is fully loaded, at the next clock pulse, two things will happen: first, the fifth bit of data is fed into input $D_3$; and second, all four bits that were in inputs $D_0$, $D_1$, $D_2$ and $D_3$ are transferred in parallel to shift register Z4, assuming that the time for transferring the data bits from $D_3$ to $D_0$ of register Z5 to $D_3$ to $D_0$ of register Z4 is negligible. Hence, four data bits, which represent a response pattern, are held in register Z4 while a new set of four data bits is being shifted into register Z5. In effect, the time it takes to load register Z5 with four new data bits is equivalent to the time it takes memory Z3 to load a response pattern, represented by the parallel loading of four data bits from I/O ports. Thus, by holding the input data in register Z4 while shifting the new data into register Z5, the memory storage time requirement, i.e., the operational speed of 20 million bits per second, is met. It should be appreciated that, of course, register Z4 would always operate in the parallel mode, as $S_0$ and $S_1$ thereof are tied together.

As was discussed previously, in practice, when data is being loaded into memory Z3, bi-directional buffer Z1 is disabled. This is to make sure that data at the outputs of buffer Z2 would not be transmitted directly to controller 10. However, instances do occur wherein it is desirable to transfer the data inputted to response memory 16 directly to controller 10. An example of this is if it is desired to adjudge on a real time basis the operational status of an equipment under test. In that instance, bi-directional buffer Z1 is activated and the data inputted to shift register Z5—be it inputted serially or in parallel—is fed to both controller 10 and memory Z3. It must be noted, however, that the data bits are transferred from buffer Z1 only once every fourth clock pulse.

Figure 3:
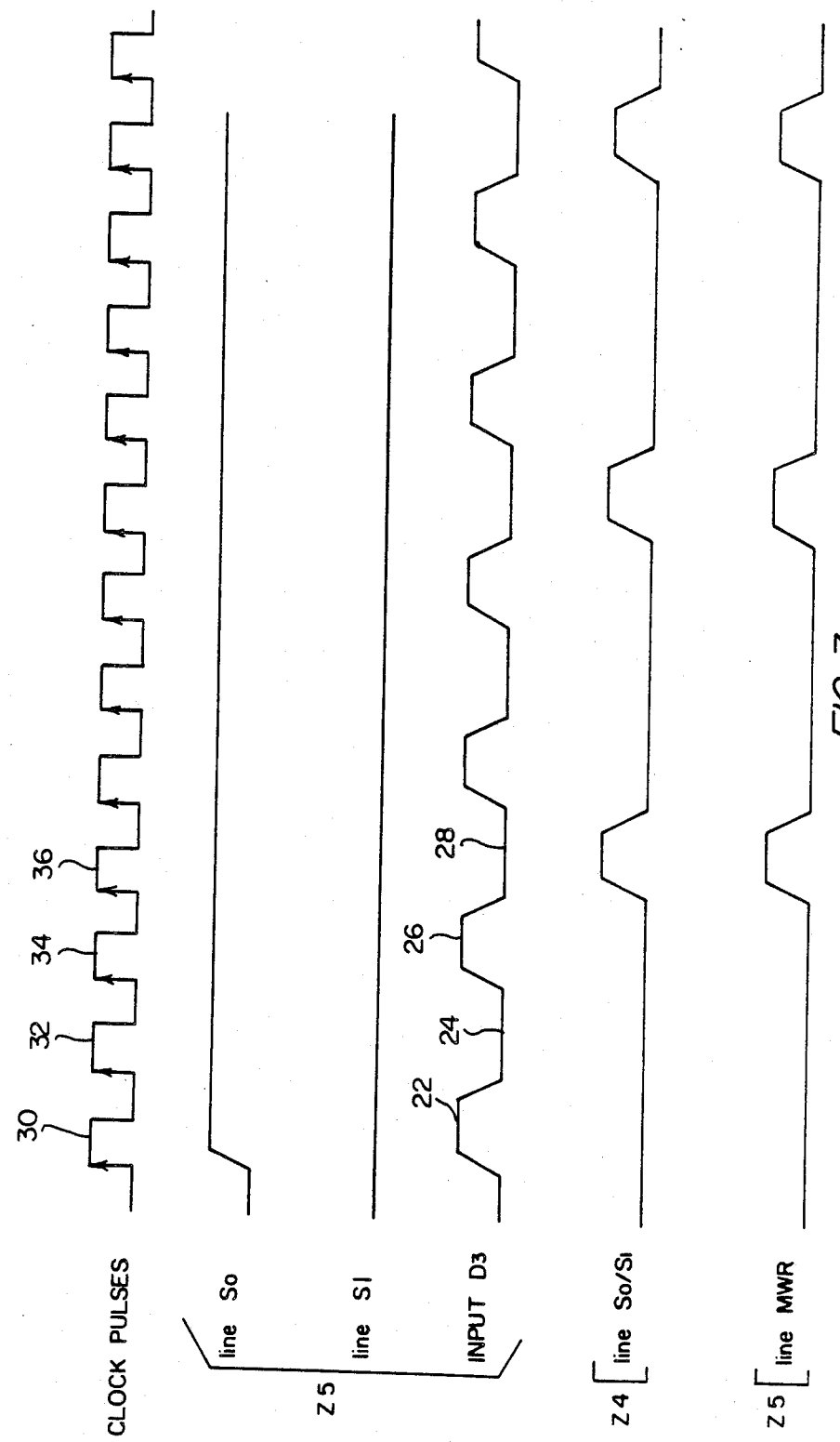
FIG. 3 is a timing diagram of the FIG. 2 embodiment.

FIG. 3 is a timing diagram showing the operation of the different components of response memory 16. As shown, lines $S_0$ and $S_1$ of register Z5 are configured to set the same shift register into a shifting mode. At a first clock pulse, designated by 30, a data bit 22 is shifted into register Z5 at input $D_3$, which is the same as $Q_3$. At a second clock pulse 32, a new data bit represented by 24 is shifted into $D_3$ ($Q_3$); and data bit 22, which was in $D_3$ ($Q_3$) a clock pulse earlier, is shifted to $D_2$ ($Q_2$). Similarly, for additional clock pulses, designated for example by 34 and 36, respective additional data bits 26 and 28 are fed into $D_3$ ($Q_3$) of register Z5. Accordingly, one data bit at a time for each of the first four clock pulses is loaded into register Z5. Too, at the fourth clock pulse, the $S_0/S_1$ line of register Z4 is changed from a "no op" state to an "op" state, thereby activating register Z4. Consequently, data which had been shifted into register Z5 is transferred in parallel to register Z4. Immediately thereafter, line $S_0/S_1$ of register Z4 goes back from the "op" state to the "no op" state. Thus, for the next four clock pulses, no operation is taken place in register Z4, as the data bits stored therein are held. Meanwhile, register Z5 is being loaded by four new data bits. At the end of the next four clock pulse cycles, line $\overline{MWR}$ of memory Z3, in addition to line $S_0/S_1$ of shift register Z4 and line RESPEN of buffer Z2, are activated. This leads to the transferring of the four data bits from register Z4 to the I/O ports of memory Z3. And in accordance with the address set by address lines BADR0 to BADR11, the four data bits, representing one response pattern, are appropriately stored. The address of memory Z3 is of course incremented and the sequence is repeated again in cycles of four clock pulses.

For the parallel loading of the response patterns, as was discussed previously, no serial shifting is required in register Z5. Therefore, data bits appearing at input pins 8, 7, 5 and 4 of register Z5 are loaded into the same input at a first clock pulse. At the next clock pulse, a new set of data bits is again loaded into register Z5, while the data bits which were previously loaded therein are transferred directly to memory Z3—assuming that, in the meantime, both register Z4 and buffer Z2 are activated. In essence, in the parallel mode, register Z4 and buffer Z2 become invisible and the data bits appear to be transmitted directly from the output pins of register Z5 to memory Z3, to be stored in parallel at whatever data rate memory Z3 is operating.

Insofar as the present invention is subject to many variations, modifications and changes in detail, it should be understood that all matters described throughout the specification and shown in the accompanying drawings te interpreted only illustratively and not in a limiting sense. Accordingly, it is intended that the invention be limited only by the spirit and scope of the appended claims.

I claim:

1. In an apparatus for testing an equipment connected thereto and for determining the operational status of the equipment, the apparatus including at least a controller means connected bidirectionally to stimulator and response memory means, the stimulator means inputting stimulus patterns to the equipment via a driver means and the response memory means receiving from the equipment via a receiver means patterns responsive to the stimulus patterns, the response memory means comprising:

first register means having a plurality of inputs connected to the receiver means for accepting therefrom the response patterns generated from the equipment when stimulus patterns are applied thereto, each of the response patterns having a plurality of data bits, the first register means communicating with the controller means for accepting the data bits at a first data rate when the data bits are transmitted serially from the receiver means and for accepting the data bits at a second data rate when the data bits are transmitted in parallel from the receiver means;

second register means having a plurality of inputs each connected to a corresponding output of the first register means for receiving in parallel from the first register means the data bits of each of the response patterns, the data bits of respective response patterns having been fully loaded into the first register means;

storage means having a plurality of I/O ports each corresponding to a respective output of the second register means, the storage means receiving and storing in parallel and at the second data rate in selective locations the data bits of each of the response patterns from the second register means;

means connected to the storage means for outputting in parallel the data bits of the response patterns from the storage means to the controller means, the outputting means having a plurality of inputs and outputs equal in number to the I/O ports;

wherein, upon instructions from the controller means, at least one particular response pattern is chosen from the storage means and outputted to the controller means for ascertaining the operational status of the equipment.

2. Response memory means according to claim 1, further comprising:

buffer means (Z2) interposed between the output of the second register means and the I/O ports of the storage means (Z3) for, upon commands from the controller means (10), establishing a connection between the outputs of the second register means and the I/O ports, the buffer means further preventing data bits outputted from the storage means (Z3) from traversing through the second (Z4) and first (Z5) register means.

3. Response memory means according to claim 2, wherein the buffer means (Z2) is further connected to the outputting means; and wherein, upon commands from the controller means (10), data bits stored in the second register means (Z4) can be directly outputted in parallel through the buffer means (Z2) and the outputting means (Z1) to the controller means (10).

4. Response memory means according to claim 1, wherein the storage means (Z3) comprises address means (BADR0–BADR11) for locating the selective locations.

5. Response memory means according to claim 1, wherein the outputting means (Z1) comprises a bi-direction bus driver.

6. Response memory means according to claim 1, wherein the storage means (Z3) comprises a RAM.

7. Response memory means according to claim 1, wherein the first (Z5) and second (Z4) register means comprise parallel/serial shift registers.

8. Response memory means according to claim 2, wherein the buffer means (Z2) comprises a tri-state buffer.

9. An apparatus having at least a controller means connected bidirectionally to stimulator and response memory means for testing an equipment connected thereto, the stimulator means feeding stimulus patterns, via a driver means, to the equipment and the response memory means receiving from the equipment, via a receiver means, patterns responsive to the stimulus patterns, wherein the response memory means comprising:

first register means connected to the receiver means for accepting therefrom response patterns educed from the equipment when stimulus patterns are applied thereto, each of the response patterns having a plurality of data bits, the first register means communicating with the controller means for loading and shifting the data bits of each response pattern serially at a first data rate when the data bits are transmitted singly from the receiver means and for loading the data bits at a second data rate when the data bits are transmitted in parallel from the receiver means;

second register means having a plurality of inputs each connected respectively to an output of the first register means for receiving in parallel from the first register means the loaded data bits of respective response patterns;

buffer means connected to the second register means for providing parallel outputs of the loaded data bit;

storage means having a pluraltiy of I/O ports each connected to a respective output of the buffer means for selectively storing in parallel the data bits of the response patterns;

wherein, notwithstanding whether the data bits of the response patterns are inputted serially or in parallel from the equipment to the first register means, the storage means stores the response patterns at a fixed data rate.

10. Response memory means according to claim 9, further comprising:

outputting means (Z1) having a plurality of inputs connected to the I/O ports of the storage means (Z3);

whereby, upon commands from the controller means (10), data bits representing particular response patterns chosen from the storage means (Z3) are transmitted through the outputting means to the controller means for providing status checks of the equipment (4) for corresponding stimulus patterns.

11. Response memory means according to claim 10, wherein the fixed data rate equals the second data rate.

12. Response memory means according to claim 11, wherein the buffer means (Z2) is further connected to the outputting means (Z1); and wherein, upon commands from the controller means (10), data bits stored in the second register means (Z4) can be directly outputted through the buffer means (Z2) and the outputting means (Z1) through to the controller means.

13. Response memory means according to claim 12, wherein the storage means (Z3) comprises address means (BADR0–BADR11) for selectively storing the data bits of the response patterns.

14. Response memory means according to claim 13, wherein the outputting means (Z1) comprises a bi-direction bus driver.

15. Response memory means according to claim 13, wherein the storage means (Z3) comprises a RAM.

16. Response memory means according to claim 13, wherein the first (Z5) and second (Z4) register means comprise parallel/serial shift registers.

17. Response memory means according to claim 13, wherein the buffer means (Z2) comprises a tri-state buffer.

* * * * *

UNITED STATES PATENT AND TRADEMARK OFFICE
CERTIFICATE OF CORRECTION

PATENT NO. : 4,773,071
DATED : September 20, 1988
INVENTOR(S) : Robert E. Nielsen It is certified that error appears in the above-identified patent and that said Letters Patent is hereby corrected as shown below:

Column 2, line 50, delete "to the same".

Column 6, line 38, change "te" to -- be --.

Column 6, line 61, change "reciever" to --receiver--.

Column 8, line 18, change "pluraltiy" to --plurality--.

Signed and Sealed this

Twenty-eighth Day of February, 1989

*Attest:*

DONALD J. QUIGG

*Attesting Officer*   *Commissioner of Patents and Trademarks*